(12) United States Patent
Lin et al.

(10) Patent No.: US 12,293,941 B2
(45) Date of Patent: May 6, 2025

(54) GALLIUM NITRIDE DEVICE WITH FIELD PLATE STRUCTURE AND METHOD OF MANUFACTURING THE SAME

(71) Applicant: UNITED MICROELECTRONICS CORP., Hsin-Chu (TW)

(72) Inventors: Da-Jun Lin, Kaohsiung (TW); Fu-Yu Tsai, Tainan (TW); Bin-Siang Tsai, Changhua County (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 385 days.

(21) Appl. No.: 17/835,983

(22) Filed: Jun. 9, 2022

(65) Prior Publication Data

US 2023/0377952 A1 Nov. 23, 2023

(30) Foreign Application Priority Data

May 20, 2022 (CN) .......................... 202210558816.0

(51) Int. Cl.
| | | |
|---|---|---|
| H10D 64/00 | (2025.01) | |
| H01L 21/304 | (2006.01) | |
| H01L 21/3105 | (2006.01) | |
| H01L 21/311 | (2006.01) | |
| H01L 21/768 | (2006.01) | |

(52) U.S. Cl.
CPC ...... *H01L 21/76813* (2013.01); *H01L 21/304* (2013.01); *H01L 21/31056* (2013.01); *H01L 21/31144* (2013.01); *H10D 64/111* (2025.01)

(58) Field of Classification Search
CPC .......................... H01L 21/76807–76813; H01L 2221/1015–1036; H01L 29/402; H01L 29/404; H01L 21/304; H01L 21/31056; H01L 21/31144; H10D 64/111; H10D 30/475; H10D 64/256; H10D 64/112; H10D 62/343; H10D 62/8503; H10D 30/015; H10D 30/4732
See application file for complete search history.

(56) References Cited

U.S. PATENT DOCUMENTS

| | | | | |
|---|---|---|---|---|
| 7,119,399 | B2* | 10/2006 | Ma ....................... | H10D 64/517 |
| | | | | 257/341 |
| 8,933,486 | B2* | 1/2015 | Wu ...................... | H10D 30/015 |
| | | | | 257/195 |
| 9,634,112 | B2* | 4/2017 | Yoon ..................... | H10D 64/112 |
| 11,355,596 | B2* | 6/2022 | Liu ...................... | H10D 30/0281 |

(Continued)

*Primary Examiner* — Maliheh Malek
(74) *Attorney, Agent, or Firm* — Winston Hsu

(57) ABSTRACT

A gallium nitride (GaN) device with field plate structure, including a substrate, a gate on the substrate and a passivation layer covering on the gate, a source and a drain on the substrate and the passivation layer, a stop layer on the source, the drain and the passivation layer, and dual-damascene interconnects connecting respectively with the source and the drain, wherein the dual-damascene interconnect is provided with a via portion under the stop layer and a trench portion on the stop layer, and the via portion is connected with the source or the drain, and the trench portion of one of the dual-damascene interconnects extends horizontally toward the drain and overlaps the gate below in vertical direction, thereby functioning as a field plate structure for the GaN device.

11 Claims, 4 Drawing Sheets

(56) References Cited

U.S. PATENT DOCUMENTS

| | | | |
|---|---|---|---|
| 11,637,068 B2* | 4/2023 | Stamper | H01L 21/76898 |
| | | | 257/506 |
| 11,972,999 B2* | 4/2024 | Levy | H10D 64/411 |
| 2008/0014690 A1* | 1/2008 | Chu | H10D 30/603 |
| | | | 257/E29.268 |
| 2012/0228704 A1* | 9/2012 | Ju | H10D 30/65 |
| | | | 257/E29.256 |
| 2016/0204074 A1* | 7/2016 | Lin | H01L 21/78 |
| | | | 257/76 |
| 2017/0263717 A1* | 9/2017 | Lin | H10D 30/0281 |
| 2017/0278963 A1* | 9/2017 | Liu | H01L 23/535 |
| 2019/0267455 A1* | 8/2019 | Lin | H10D 62/371 |
| 2019/0288112 A1* | 9/2019 | Wang | H10D 30/65 |
| 2020/0194552 A1* | 6/2020 | Dasgupta | H10D 64/518 |
| 2021/0184005 A1* | 6/2021 | Liu | H01L 21/76802 |
| 2021/0336043 A1* | 10/2021 | Birner | H10D 64/111 |
| 2022/0310803 A1* | 9/2022 | Watanabe | H01L 21/31116 |
| 2022/0319840 A1* | 10/2022 | Patel | H01L 21/31144 |
| 2023/0061900 A1* | 3/2023 | Wu | H10D 62/156 |
| 2023/0178449 A1* | 6/2023 | Levy | H10D 62/126 |
| | | | 257/565 |
| 2023/0387285 A1* | 11/2023 | Chikamatsu | H10D 64/111 |
| 2024/0063219 A1* | 2/2024 | Sharma | H10D 84/05 |
| 2024/0085247 A1* | 3/2024 | Sharma | G01K 7/226 |
| 2024/0213333 A1* | 6/2024 | Wang | H01L 21/31053 |

\* cited by examiner

GALLIUM NITRIDE DEVICE WITH FIELD PLATE STRUCTURE AND METHOD OF MANUFACTURING THE SAME

BACKGROUND OF THE INVENTION

1. Field of the Invention

The present invention relates generally to a gallium nitride (GaN) device, and more specifically, to a GaN device using dual-damascene interconnects as field plates.

2. Description of the Prior Art

Most of semiconductor devices currently available in the world are silicon-based semiconductor using silicon as their substrate and channel. However, in the application of high-voltage, high-power devices, silicon-based devices may suffer high power consumption since their on-state resistance $R_{DS}(on)$ is too large. Furthermore, in high-frequency operation, silicon-based device has relatively lower switch frequency, thus its performance is no match for those using wide band gap compound semiconductor material like gallium nitride (GaN) or silicon carbide (SiC). In comparison to conventional silicon-based material, Wide band gap compound semiconductor material like GaN is provided with larger band gap, lower on-state resistance, thus it is more durable and applicable in high temperature, high voltage, high frequency and high current applications, and also with better energy conversion efficiency. Thus, GaN device is provided all kinds of excellent properties required in the semiconductor device like good heat dissipation, small size, lower power consumption and high power, which is suitable for the application of power semiconductor. With the urgent demand in high-end industry like 5G communication and electric car, GaN material has emerged to be a promising candidate of the third generation semiconductor materials in the future.

Common GaN device is usually provided with field plate structures to improve breakdown voltage and threshold voltage of the GaN device as well as reduce on-state resistance between gate and drain in high-voltage operation. However, currently conventional field plate structure may only promote limited and performance for GaN device, thus those of skilled in the art in the industry still need to further develop and improve current field plate design, in hope of further improving RC and power consumption of the GaN device on the basis of field plate mechanism.

SUMMARY OF THE INVENTION

In the light of the shortcoming of the filed plate structure of currently available conventional GaN device, the present invention hereby provides a novel design of field plate structure, featuring the use of dual-damascene interconnect that connects source or drain as an additional field plate to further improve RC and power consumption of the GaN device.

One aspect of present invention is to provide a gallium nitride device with field plate structure, including a substrate, a gate on the substrate, a passivation layer covering on the gate, a source and a drain on the substrate and the passivation layer, a stop layer on the source, the drain and the passivation layer, and dual-damascene interconnects connecting respectively with the source and the drain, wherein the dual-damascene interconnect is provided with a via portion under the stop layer and a trench portion on the stop layer, and the via portion is connected with the source or the drain, and the trench portion of one of the dual-damascene interconnects extends horizontally and overlaps the gate in vertical direction, thereby functioning as a field plate structure for the GaN device.

Another aspect of present invention is to provide a method of manufacturing a GaN device with field plate structure, including steps of providing a substrate, forming a gate on the substrate and a passivation layer covering the substrate and the gate, forming recesses in the passivation layer defining a source region and a drain region and exposing the underlying substrate, forming a source and a drain on the passivation layer, wherein the source and the drain directly contact the substrate, forming a first ILD layer, a stop layer and a second ILD layer sequentially on the source, the drain and the passivation layer, patterning the first ILD layer, the stop layer and the second ILD layer, thereby forming dual-damascene recesses and exposing the source and the drain, wherein the dual-damascene recess is provided with a via hole portion under the stop layer and a trench portion on the stop layer, and the via hole portion exposes a part of the source or a part of the drain, and the trench portion of one of the dual-damascene recess extends horizontally toward the drain and overlaps the gate in vertical direction, and filling metal in the dual-damascene recesses to form dual-damascene interconnects connecting respectively with the source and the drain.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
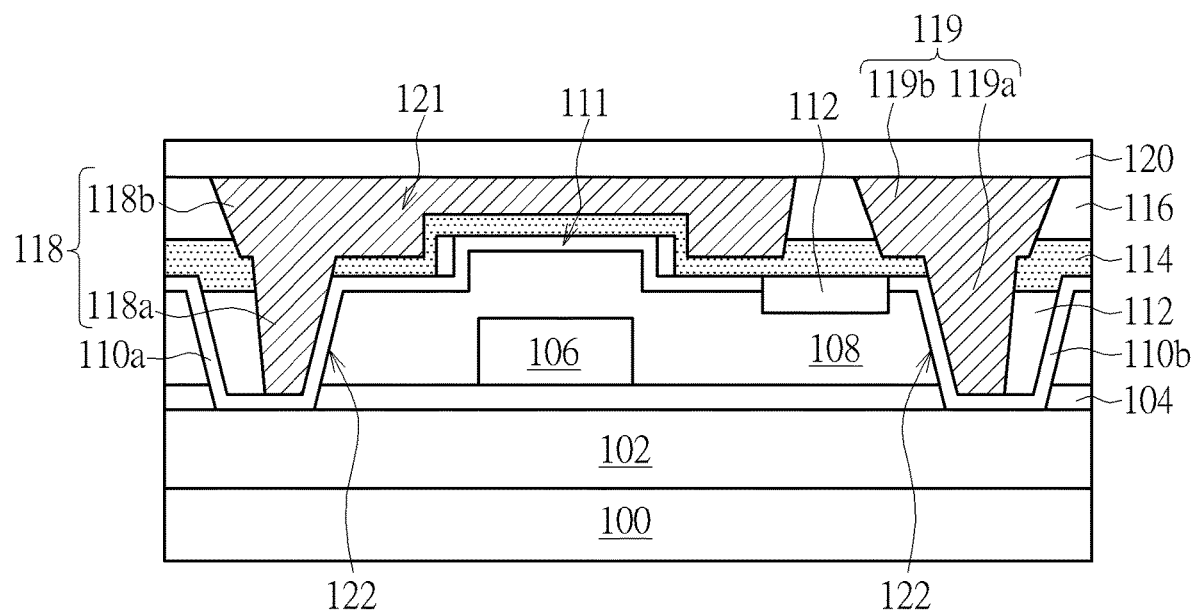
FIG. 1 is a schematic cross-section of a GaN device in accordance with one preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

In addition, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or heterogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

A structure of gallium nitride (GaN) device and method of manufacturing the same will now be described in following embodiments. GaN device is a kind of field effect transistor (FET) incorporating a junction between two materials with different band gaps (i.e., a heterojunction) as a channel instead of using a doped region as a channel, as is generally the case for metal oxide semiconductor field effect transistors (MOSFETs).

Please refer first to FIG. 1, which is a schematic cross-section of a GaN device in accordance with one preferred embodiment of the present invention. The GaN device of present invention is constructed on a substrate 100. The substrate 100 may be a silicon layer having <111> lattice plane to serve as a base for setting components of the device. The Si <111> layer may provide an optimal lattice matching with overlying layers, such as an overlying gallium nitride (GaN) buffer layer or superlattic layer, in order to prevent the problem like dislocations or defects resulted from mis-matching lattice constants and thermal expansion coefficients between two materials during later heteroepitaxy process. In some embodiments, the substrate 100 may be made of compound semiconductor like silicon carbide (SiC), gallium arsenic (GaAs), indium arsenide (InAs), or indium phosphide (InP). In some embodiments, the substrate 100 may be made of semiconductor alloy like silicon germanium (SiGe), silicon germanium carbide (SiGeC), gallium arsenic phosphide (GaAsP), or gallium indium phosphide (GaInP).

Refer still to FIG. 1. In the structure of GaN device of the present invention, a buffer layer 102 is formed on the substrate 100. The buffer layer 102 is formed to define a high-resistance layer, in order to increase the breakdown voltage of GaN device and reduce its vertical current leakage. The resistance of buffer layer 102 is higher than the resistivity of channel layer to be formed in later process. In some embodiments, the buffer layer 102 includes one or more group III-V compound semiconductor layers. Examples of these group III-V compound semiconductors include but not limited to gallium nitride (GaN), aluminum gallium nitride (AlGaN), Indium gallium nitride (InGaN) and Indium aluminum gallium nitride (InAlGaN). In some embodiments, the buffer layer 102 may also include dopants to attain a predetermined high resistivity. In some embodiments, these dopants are p-type dopant. In some embodiments, the buffer layer 102 includes GaN doped with p-type dopant (p-GaN). Examples of the p-type dopant include but not limited to carbon (C), iron (Fe), magnesium (Mg) or zinc (Zn). In other embodiments, structures like additional nucleation layer and superlattice layer stack may be further formed between the buffer layer 102 and substrate 100 to further prevent dislocation or defect issue. In addition, the buffer layer 102 may be formed into mesa structure to further improve the isolation effect between devices.

Refer still to FIG. 1. In the structure of GaN device of the present invention, a channel layer 104 is formed over the buffer layer 102. In the embodiment of present invention, the channel layer 104 has a resistivity lower than the buffer layer 102, for improving the current performance of GaN device. In some embodiments, the channel layer 104 includes one or more Group III-V compound layers. Examples of Group III-V compound layers include but not limited to AlGaN, InGaN and InAlGaN. In some embodiments, the channel layer 104 may include alternatingly arranged p-doped and n-doped Group III-V compound layers.

Furthermore, a barrier layer (not shown), such as an aluminum nitride (AlN) layer, is further formed over the channel layer 104. A heterojunction is formed between the channel layer 104 and the barrier layer, with a band gap discontinuity exists therebetween, so that electrons produced by piezoelectricity in the barrier layer would fall into the channel layer 104, thereby creating a thin layer of highly mobile conducting electrons, i.e. the two dimensional electron gas (2DEG), adjacent the interface between the two layer structures. Please note that in the embodiment above, the electrons in the 2DEG are charge carriers in the channel layer 104, and the high electron mobility transistor (HEMT) may be constituted after forming components like gate and source/drain on the barrier layer in later processes. In other embodiment, for example in p-type GaN device, the charge carriers formed between the barrier layer and the channel layer 104 would be two dimensional hole gas (2DHG), and the high hole mobility transistor (HHMT) may be constituted after forming components like gate and source/drain on the barrier layer in later processes.

Refer still to FIG. 1. In the structure of GaN device of the present invention, a gate 106 is formed on the channel layer 104. The gate 106 may be p-type doped gallium nitride (p-GaN) layer, which may deplete the charge carriers generated in the channel layer 104 below to alter the device into normally-off state. In some embodiments, gate 106 has a constant doping concentration. Examples of the p-type dopant in the p-doped GaN layer 106 includes but not limited to carbon (C), iron (Fe), magnesium (Mg) and zinc (Zn). Other additional p-GaN layers with different doping concentration may also be formed over the gate 106 to increase the operation voltage for the gate of the device.

Refer still to FIG. 1. In the structure of GaN device of the present invention, a passivation layer 108, such as a silicon nitride layer, is formed on the gate 106 and channel layer 104 to provide isolation effect for the gate and source/drain of the GaN device and reduce current leakage. The passivation layer 108 may further function as a dielectric layer for field plate portions or field plate structures in later processes. In the embodiment, the material of passivation layer 108 may be selected from silicon oxide, aluminum oxide, aluminum nitride, silicon oxynitride, Teflon® or hafnium oxide.

Refer still to FIG. 1. In the structure of GaN device of the present invention, source 110a and drain 110b are formed respectively at two sides of the gate 106. In the embodiment of present invention, source 110a and drain 110b are conformally formed along the surface of recess 122 in the passivation layer 108 and along the surface of passivation layer 108. The gate 106, source 110a, drain 110b and channel layer 104 constitute collectively the GaN device of present invention. The current of the device and the switch of the channel may be controlled by applying voltage to gate 106. In some embodiments, source 110a and drain 110b include one or more conductive material, such as Ti/Al/Ni/Au, the multilayer structure thereof or the silicide thereof, and form ohmic contacts through the process like rapid thermal annealing. Source 110a and drain 110b would extend through the channel layer 104 and contact the underlying buffer layer 102. In other embodiment, source 110a and drain 110b may contact the channel layer 104 rather than extend through it. Furthermore, it can be seen in the figure that the source 110a formed in the process is provided with a horizontally extending portion 111 extending horizontally and conformally on the passivation layer 108, and is preferably close to the position of drain 110b and overlaps the gate 106 in vertical direction. The aforementioned horizontally extending portion 111 of source 110a may function as one of field plate structures in the embodiment of present invention, to modify the electric field there in order to attain better breakdown voltage and reduce on-state resistance $R_{DS}$ (on) in high-voltage operation, further improving RC and power consumption of the GaN device. In some embodiment, drain 110b may also be formed with similar horizontally extending portion to function as field plate structure.

Refer still to FIG. 1. In the structure of GaN device of the present invention, a first interlayer dielectric (ILD) layer 112 is formed on the surfaces of passivation layer 108, source 110a and drain 110b, with material like silicon oxide, wherein the first ILD layer 112 would fill up the remaining space in the recess 122, and a part of the first ILD layer 112 lies between the source 110a and drain 110b and isolates them. A stop layer 114 and a second ILD layer 116 are further formed sequentially on the first ILD layer 112 with material respectively like silicon nitride and silicon oxide. Stop layer 114 covers conformally on the surface of first ILD layer 112, wherein parts of the stop layer 114 directly contact the underlying source 110a and drain 110b. In the embodiment of present invention, stop layer 114 may prevent dual-damascene interconnects formed in later processes extending through or electrically migrating into the underlying first ILD layer 112 to short-circuit with the source 110a or drain 110b. The second ILD layer 116 formed on the stop layer 114 is provided with a flat top surface and serves as a level for the trench portion of dual-damascene interconnects to be formed therein in later processes.

Refer still to FIG. 1. Dual-damascene interconnects 118, 119 are formed in the layer structures like the aforementioned first ILD layer 112, stop layer 114 and second ILD layer 116, with material like copper to connect respectively with the source 110a and drain 110b below. In the embodiment of present invention, dual-damascene interconnects 118, 119 are both consisted of a via portion 118a, 119a and a trench portion 118b, 119b, wherein the via portion 118a, 119a is generally formed in the level of first ILD layer 112, for example, formed in the recess 122 as shown in the figure and connected with the source 110a and drain 110b below, while other portion of the recess 122 is filled up by the first ILD layer 112. The trench portions 118b, 119b of dual-damascene interconnects 118, 119 are generally formed in the level of second ILD layer 116, with its top surface flush with the surface of surrounding second ILD layer 116.

Furthermore, in the embodiment of present invention, the trench portion 118b of dual-damascene interconnect 118 that connects with source 110a is provided with a horizontally extending portion 121 extending horizontally on the stop layer 114. Similar to the underlying horizontally extending portion 111 of the source 110a, the trench portion 118b of dual-damascene interconnect 118 preferably extends close to the trench portion 119b of dual-damascene interconnect 119 that connects the drain 110b and overlaps the gate 106 below in vertical direction. The horizontally extending portion 121 and trench portion 119b may be spaced apart by the second ILD layer 116. Similar to the horizontally extending portion 121 of source 110a, the aforementioned horizontally extending portion 121 of dual-damascene interconnect 118 may function as another field plate structure in the embodiment of present invention to modify the electric field there, thereby attaining better breakdown voltage and reduce on-state resistance $R_{DS}$ (on) in high-voltage operation, further improving RC and power consumption of the GaN device. In some embodiments, the dual-damascene interconnect 119 that connects with the drain 110b may also be formed with similar horizontally extending portion to function as field plate structure. Lastly, an etch stop layer 120 is formed on the flat top surfaces of dual-damascene interconnects 118, 119 and second ILD layer 116. The material of etch stop layer 120 may be silicon nitride or silicon carbon nitride to function as an etch stop layer in later photolithography process of forming the overlying patterns.

After the structure of GaN device of the present invention is described, the process of manufacturing the GaN device of present invention will now be described in following embodiments with reference sequentially to the cross-sections of FIG. 2 to FIG. 8.

Figure 2:
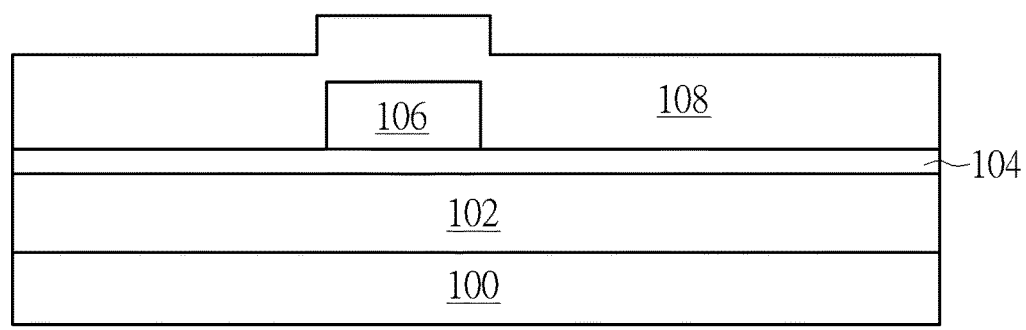
FIG. 2 to FIG. 8 are schematic cross-sections illustrating a process flow of manufacturing the GaN device in accordance with one preferred embodiment of the present invention.

First, please refer to FIG. 2. A substrate 100 is provided to serve as abase for setting the components of GaN device in the present invention. The substrate 100 may be a silicon wafer with <111> lattice plane to provide an optimal lattice matching with overlying layers, in order to prevent the problem like dislocations or defects during later heteroepitaxy process. In some embodiments, the substrate 100 may be made of compound semiconductor like silicon carbide (SiC), gallium arsenic (GaAs), indium arsenide (InAs), or indium phosphide (InP). In some embodiments, the substrate 100 may be made of semiconductor alloy like silicon germanium (SiGe), silicon germanium carbide (SiGeC), gallium arsenic phosphide (GaAsP), or gallium indium phosphide (GaInP).

Thereafter, a buffer layer 102 is formed on the substrate 100. The buffer layer 102 is formed to define a high-resistance layer, in order to increase breakdown voltage of the GaN device and reduce its vertical current leakage. The material of buffer layer 102 may include but not limited to gallium nitride (GaN), aluminum gallium nitride (AlGaN), Indium gallium nitride (InGaN) and Indium aluminum gallium nitride (InAlGaN), which may be formed through a metal-organic chemical vapor deposition (MOCVD) process, a molecular beam epitaxy (MBE) process and a hydride vapor phase epitaxy (HVPE) process. In other embodiment, the buffer layer 102 may be formed into mesa structure to further improve the isolation effect between devices.

After the buffer layer 102 is formed, a channel layer is then formed on the buffer layer 102. In the embodiment of present invention, the channel layer 104 may include one or more Group III-V compound layers. Examples of Group III-V compound layers include but not limited to AlGaN, InGaN and InAlGaN. In some embodiments, the channel layer 104 may include alternatingly arranged p-doped and n-doped Group III-V compound layers. Similarly, the buffer layer 104 may be formed through an epitaxial growth process, which includes but not limited to a metal-organic chemical vapor deposition (MOCVD) process, a molecular beam epitaxy (MBE) process and a hydride vapor phase epitaxy (HVPE) process. A barrier layer (not shown), such as an aluminum nitride (AlN) layer, may be further formed over the channel layer 104 to produce two dimensional electron gas (2DEG) as the charge carrier in the channel layer 104.

Refer still to FIG. 2. After the channel layer 104 is formed, a patterned gate 106 is then formed on the channel layer 104. The gate 106 may be p-type doped gallium nitride layer (p-GaN), which may deplete the charge carriers generated in the channel layer 104 below to alter the device into normally-off state. In some embodiments, the gate 106 may be formed through an epitaxial growth process, which includes but not limited to a metal-organic chemical vapor deposition (MOCVD) process, a molecular beam epitaxy (MBE) process and a hydride vapor phase epitaxy (HVPE) process, and may cooperate with a photolithography process to define its gate pattern.

Please note that in the process of present invention, steps of forming the aforementioned buffer layer 102, channel layer 104, p-GaN layer 106 may be in-situ performed in the same process chamber without removing to other chambers, thereby saving cost and reducing pollution in the whole process.

Refer still to FIG. 2. After the gate 106 is formed, a passivation layer 108, such as a silicon nitride layer, is formed covering the gate 106 and channel layer 104 to provide isolation effect for the gate and source/drain of the GaN device. The passivation layer 108 may be formed through CVD process, with materials selected from silicon oxide, aluminum oxide, aluminum nitride, silicon oxynitride, Teflon® or hafnium oxide.

Figure 3:
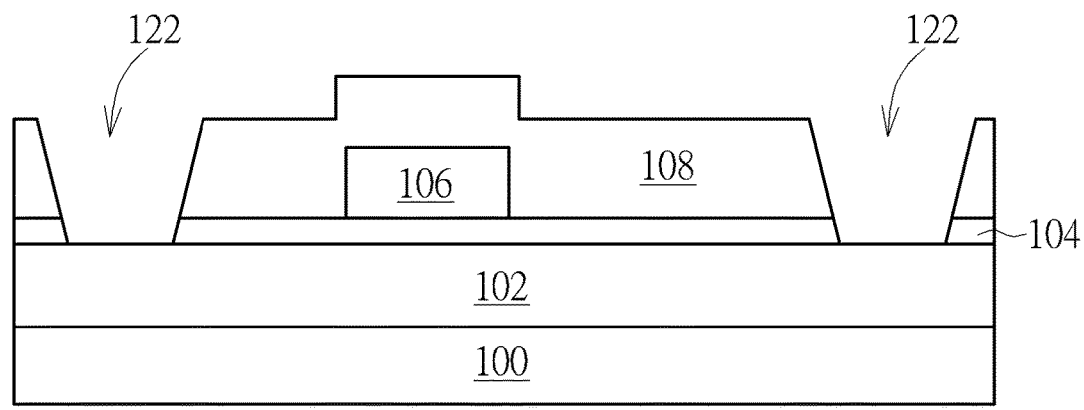

Please refer to FIG. 3. After the passivation layer 108 is formed, a photolithography process is then performed to form recesses 122 in the passivation layer 108 at two sides of the gate 106. The recess 122 extends through the underlying channel layer 104 and exposes the buffer layer 102. Since a field plate structure will be designedly formed at one side of the gate 106 in later processes, one side of the recess 122 is preferably formed farther from the gate 106.

Figure 4:
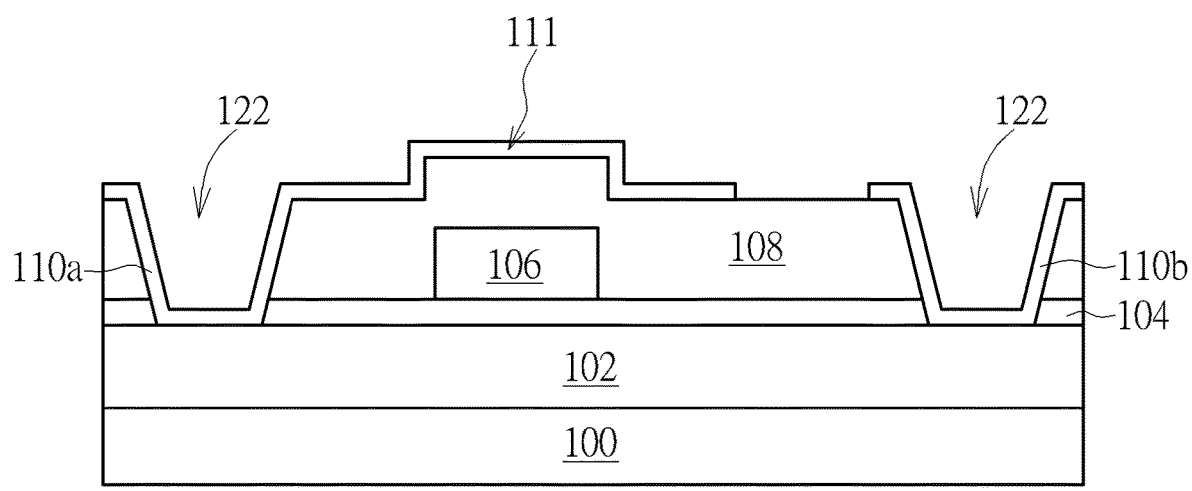

Please refer to FIG. 4. After the recess 122 is formed, a source 110a and a drain 110b are formed on the surfaces of recesses 122. In the embodiment of present invention, the source 110a and drain 110b are formed conformally along the surfaces of recesses 122 and along the surface of passivation layer 108. In some embodiments, the source 110a and drain 110b include one or more conductive materials, such as Ti/Al/Ni/Au, the multilayer structure thereof or the silicide thereof, which may be formed by forming a common material layer first through physical vapor deposition (PVD) process and then performing a photolithography process to pattern individual source 110a and drain 110b, and a rapid thermal annealing process may then be performed to form ohmic contacts. The source 110a and drain 110b formed in the embodiment may extend through the channel layer 104 to contact the underlying buffer layer 102. Please note that, it can be seen in the figure, the source 110a formed in the embodiment is provided with a horizontally extending portion extending horizontally and conformally on the passivation layer 108, and preferably extends close to the position of drain 110b and overlaps the gate 106 in vertical direction.

Figure 5:
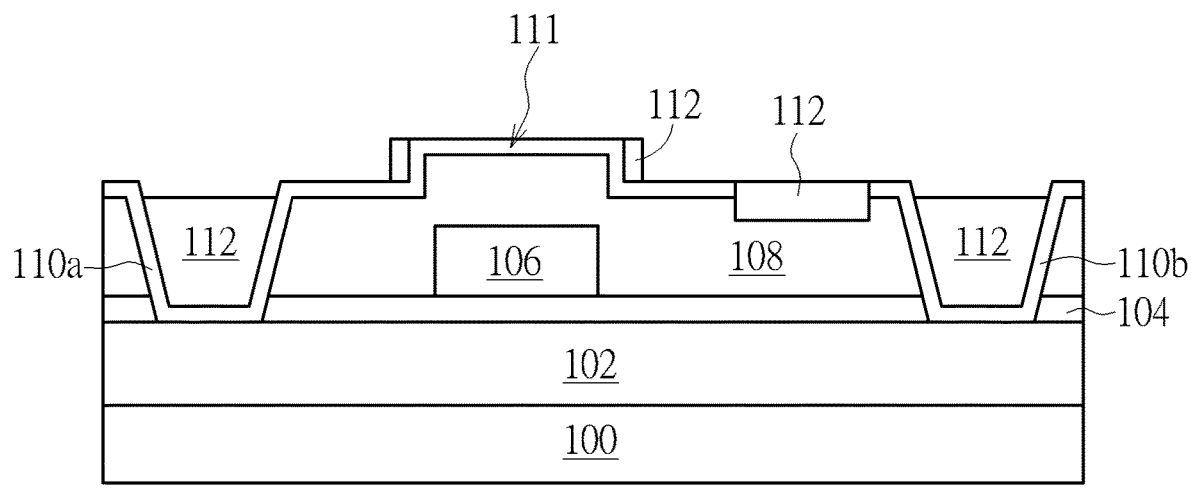

Please refer to FIG. 5. After the source 110a and drain 110b are formed, a first ILD layer 112 is formed on the surfaces of passivation layer 108, source 110a and drain 110b. The material of first ILD layer 112 may be silicon oxide, which may be formed by first covering a thick silicon oxide layer on entire substrate through CVD process and then performing an etchback process. The source 110a and drain 110b in this step function like an etch stop layer. The first ILD layer formed in the process would fill up the remaining space in the recess, and a part of the first ILD layer 112 lies between the source 110a and drain 110b and isolates them. In addition, as shown in the figure, parts of the first ILD layer 112 may remain on sidewalls of the horizontally extending portion 111 of source 110a and parts of the horizontally extending portion 111 may be exposed.

Figure 6:
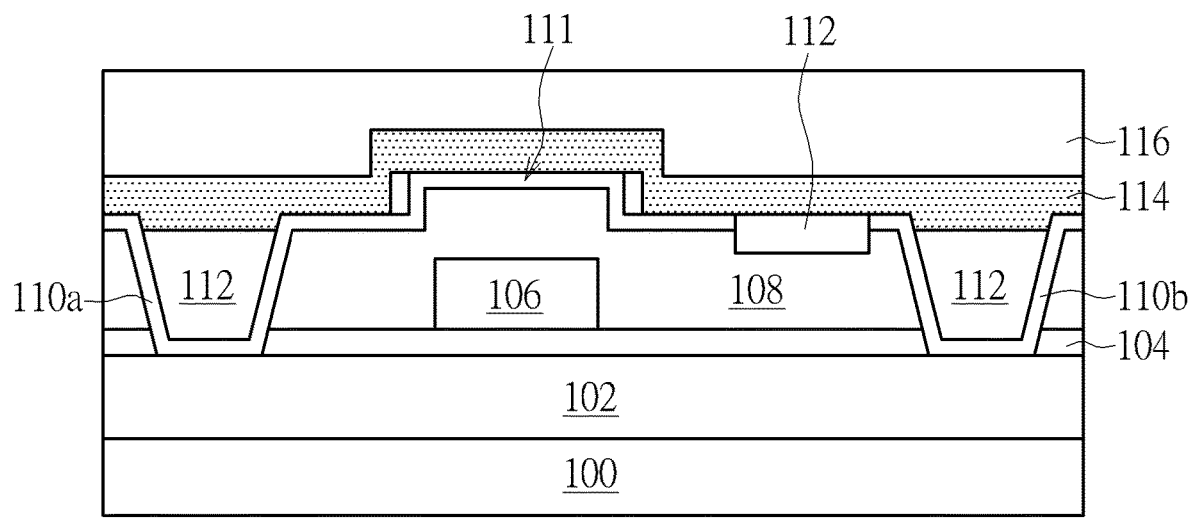

Please refer to FIG. 6. After the first ILD layer 112 is formed, a stop layer 114 and a second ILD layer 116 are formed sequentially on the first ILD layer. The material of stop layer 114 and second ILD layer 116 may be silicon nitride and silicon oxide respectively, which may be deposited through CVD process, wherein the stop layer 114 covers conformally on the surface of first ILD layer 112, and parts of the stop layer 114 directly contact the exposed source 110a and drain 110b below. A planarization process like chemical mechanical planarization (CMP) process is further performed to provide a flat process surface after the second ILD layer 116 is formed.

Figure 7:
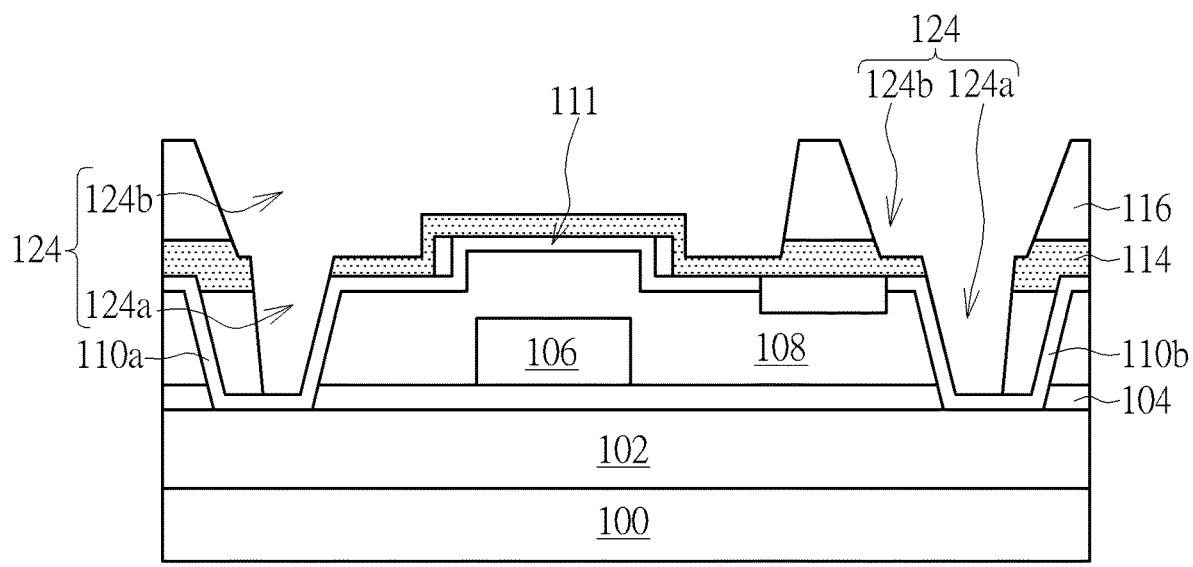

Please refer to FIG. 7. After the stop layer 114 and second ILD layer 116 are formed, a dual-damascene process is then performed to form dual-damascene recesses 124 in the first ILD layer 112, stop layer 114 and second ILD layer 116. The dual-damascene process may include two photolithography processes that form the via hole portion 124a and trench portion 124b of the dual-damascene recess 124 respectively. In the process, the via hole portion may be formed first (via first process) or the trench portion may be formed first (trench first process), wherein the via hole portion 124a is formed generally in the level of passivation layer 108, while the trench portion 124b is formed generally in the level of second ILD layer 116. The via hole portion 124a and the trench portion 124b of dual-damascene recess 124 formed in the embodiment are demarcated by the stop layer 114. Please note that the trench portion 124b of dual-damascene recess 124 at source side would extend horizontally toward the drain and preferably overlap the gate 106 below, in order to form the field plate structure required by the present invention.

Figure 8:
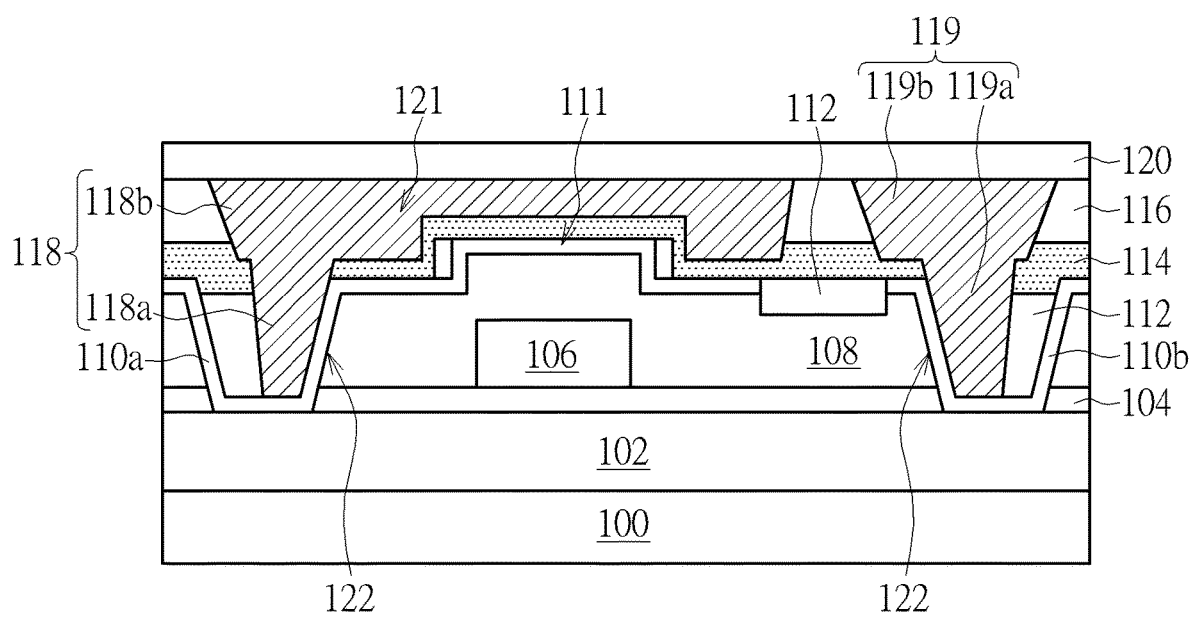

Lastly, please refer to FIG. 8. After the dual-damascene recesses 124 are formed, copper metal is then filled in the recesses to form dual-damascene interconnects 118, 119. Copper metal may be formed in the dual-damascene recesses 124 through copper electrochemical plating process, and a planarization process like CMP process is performed thereafter to remove the part outsides the surface of second ILD layer 116, so that both of their top surfaces may be flush. In the embodiment of present invention, the dual-damascene interconnects 118, 119 formed at source side and drain side are both consisted of a via portion 118a, 119a and a trench portion 118b, 119b, wherein the via portion 118a, 119a is generally formed in the level of first ILD layer 112 and connected with the source 110a and drain 110b below, while the trench portions 118b, 119b are generally formed in the level of second ILD layer 116, with their top surfaces flush with the surface of surrounding second ILD layer 116. In addition, the trench portion 118b at source side is provided with a horizontally extending portion 121 extending horizontally on the stop layer 114, similar to the horizontally extending portion 111 of the source 110a below, and this portion preferably extends close to the position of trench portion 119b of the dual-damascene interconnect 119 connecting the drain 110b and overlaps the gate 106 below in vertical direction, so as to function as another field plate structure to modify the electric field there in order to attaining better breakdown voltage and reducing on-state resistance $R_{DS}(on)$ in high-voltage operation, further improving RC and power consumption of the GaN device.

Refer still to FIG. 8. Lastly, an etch stop layer 120 is formed on the flush top surface of second ILD layer 116 and dual-damascene interconnects 118, 119, so that the manufacture of GaN device in the present invention is completed. The material of etch stop layer 120 may be silicon nitride or silicon carbon nitride, which may be formed through CVD process and may function as an etch stop layer or diffusion barrier for later back end of line (BEOL) process.

In summary to the aforementioned embodiments, it may be understood by readers that the GaN device and method of manufacturing the same provided in the present invention may form additional field plate structure extending from the dual-damascene interconnect through conventional dual-damascene interconnect approach. The field plate structures formed in this way may be isolated from the source, drain or field plate structure below through an additional intervening stop layer, so as to further improve the electrical performance of the GaN device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gallium nitride device with field plate structure, comprising:
   a substrate;
   a gate on said substrate;
   a passivation layer covering on said gate;
   a source and a drain on said substrate and said passivation layer;
   a stop layer on said source, said drain and said passivation layer; and
   dual-damascene interconnects connecting respectively with said source and said drain, wherein said dual-damascene interconnect is provided with a via portion under said stop layer and a trench portion on said stop layer, and said via portion is connected with said source or said drain, and said trench portion of one of said dual-damascene interconnects extends horizontally toward said drain and overlaps said gate in vertical direction, thereby functioning as a field plate structure for said gallium nitride device;
   wherein a first interlayer dielectric (ILD) layer and a second ILD layer is provided respectively above and below said stop layer, and said via portion of said dual-damascene interconnect is in said first ILD layer, and said trench portion of said dual-damascene interconnect is in said second ILD layer, and said via portion and said trench portion is demarcated by said stop layer.

2. The gallium nitride device with field plate structure of claim 1, wherein said passivation layer is provided with a recess exposing said substrate below, and said source and said drain extend conformally along a surface of said recess and directly contact said substrate.

3. The gallium nitride device with field plate structure of claim 1, wherein said substrate comprises a silicon layer, a buffer layer and a channel layer.

4. The gallium nitride device with field plate structure of claim 1, wherein a material of said buffer layer is gallium nitride (GaN), and a material of said channel layer is aluminum gallium nitride (AlGaN).

5. The gallium nitride device with field plate structure of claim 1, wherein said source is provided with a field plate portion extending toward said drain along a surface of said passivation layer and overlapping said gate in vertical direction, and said field plate portion is between said passivation layer and said stop layer, and said filed plate portion overlaps said trench portion of said dual-damascene structure that extends onto said gate in vertical direction.

6. The gallium nitride device with field plate structure of claim 1, further comprising an etch stop layer on said dual-damascene interconnects and said second ILD layer.

7. The gallium nitride device with field plate structure of claim 6, wherein a material of said etch stop layer is silicon nitride or silicon carbon nitride (SiCN).

8. The gallium nitride device with field plate structure of claim 1, wherein a material of said first ILD layer and said second ILD layer is silicon oxide, and a material of said stop layer is silicon nitride.

9. The gallium nitride device with field plate structure of claim 1, wherein a material of said source and said drain comprises titanium (Ti), aluminum (Al), nickel (Ni), gold (Au) or a multilayer structure thereof, or a silicide thereof.

10. The gallium nitride device with field plate structure of claim 1, wherein a material of said gate is p-type doped gallium nitride (p-GaN).

11. The gallium nitride device with field plate structure of claim 1, wherein a material of said dual-damascene interconnect is copper (Cu).

* * * * *